(12) United States Patent
Yoshida et al.

(10) Patent No.: US 11,266,044 B2
(45) Date of Patent: Mar. 1, 2022

(54) ELECTRONIC CONTROL DEVICE

(71) Applicant: Hitachi Automotive Systems, Ltd., Hitachinaka (JP)

(72) Inventors: Isamu Yoshida, Tokyo (JP); Masaru Kamoshida, Hitachinaka (JP); Toshikazu Shigyo, Hitachinaka (JP); Shiro Yamashita, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 16/759,825

(22) PCT Filed: Oct. 12, 2018

(86) PCT No.: PCT/JP2018/038223
§ 371 (c)(1),
(2) Date: Apr. 28, 2020

(87) PCT Pub. No.: WO2019/087743
PCT Pub. Date: May 9, 2019

(65) Prior Publication Data
US 2020/0352056 A1    Nov. 5, 2020

(30) Foreign Application Priority Data

Oct. 30, 2017    (JP) .............................. JP2017-209463

(51) Int. Cl.
*H05K 7/20*    (2006.01)
*H05K 1/02*    (2006.01)

(52) U.S. Cl.
CPC ....... *H05K 7/20409* (2013.01); *H05K 1/0203* (2013.01); *H05K 7/205* (2013.01)

(58) Field of Classification Search
None
See application file for complete search history.

(56) References Cited

U.S. PATENT DOCUMENTS

| 7,082,034 B2 * | 7/2006 | Tiwari | ................ | H01L 23/3675 |
| | | | | 165/185 |
| 8,373,990 B2 * | 2/2013 | Jarmany | ............ | H05K 7/20445 |
| | | | | 361/707 |

(Continued)

FOREIGN PATENT DOCUMENTS

| JP | 2003-289191 A | 10/2003 |
| JP | 2009-158796 A | 7/2009 |

(Continued)

OTHER PUBLICATIONS

International Search Report (PCT/ISA/210) issued in PCT Application No. PCT/JP2018/038223 dated Jan. 8, 2019 with English translation (three (3) pages).

(Continued)

*Primary Examiner* — Courtney L Smith
(74) *Attorney, Agent, or Firm* — Crowell & Moring LLP

(57) ABSTRACT

An electronic control device includes a heating element, a substrate, and a housing. The heating element includes an electronic component. The heating element is mounted to the substrate. The substrate is fixed to the housing via a substrate fixing portion. The housing includes a plurality of projecting portions projecting to the substrate side from a reference surface. The plurality of projecting portions have mutually different heights from the reference surface. The reference surface is a surface opposing the substrate and a reference of a height of the housing. The projecting portion highest in the height from the reference surface among the plurality of projecting portions is in contact with a surface of the substrate via a heat dissipation member. The surface of the substrate is on an opposite side of a surface where the heating element is mounted.

5 Claims, 8 Drawing Sheets

(56) References Cited

U.S. PATENT DOCUMENTS

| | | | | |
|---|---|---|---|---|
| 10,321,554 B2* | 6/2019 | Asao | .................. | H01L 25/072 |
| 2003/0184969 A1* | 10/2003 | Itabashi | .............. | H01L 23/3677 |
| | | | | 361/688 |
| 2006/0171127 A1* | 8/2006 | Kadoya | .................. | H05K 3/284 |
| | | | | 361/752 |
| 2007/0268671 A1* | 11/2007 | Brandenburg | ...... | H01L 25/0655 |
| | | | | 361/704 |
| 2011/0228498 A1* | 9/2011 | Kawai | ................ | H05K 7/20409 |
| | | | | 361/752 |
| 2013/0250521 A1* | 9/2013 | Kawai | .................. | H05K 5/0082 |
| | | | | 361/714 |

FOREIGN PATENT DOCUMENTS

| | | |
|---|---|---|
| JP | 2011-192937 A | 9/2011 |
| JP | 2013-93372 A | 5/2013 |
| JP | 2013-197405 A | 9/2013 |
| JP | 2017-130514 A | 7/2017 |
| JP | 2017-162860 A | 9/2017 |

OTHER PUBLICATIONS

Japanese-language Written Opinion (PCT/ISA/237) issued in PCT Application No. PCT/JP2018/038223 dated Jan. 8, 2019 (four (4) pages).

* cited by examiner

MODEL A

MODEL B

MODEL C

ELECTRONIC CONTROL DEVICE

TECHNICAL FIELD

The present invention relates to an electronic control device.

BACKGROUND ART

The electronic control device includes a metal housing, a lid, and a circuit board mounted inside the housing. The circuit board includes various electronic components, and the electronic components are generally mounted collectively for each function, such as a power supply system, a drive system, and an input/output system. The electronic components generate heat through operations. When the heat is not dissipated, temperatures of the electronic components increase to cause a malfunction and a breakdown. Therefore, there has been a structure where, at a position where an electronic component that generates a large amount of heat is mounted, a back surface side of the circuit board is bonded to the housing via a conductive adhesive and the like, and the heat is forcibly dissipated to the outside of the housing. There has been a structure where, by performing a surface treatment to promote absorption and dissipation of the heat to the surface of the housing, the dissipated heat is efficiently transmitted to improve a heat dissipation performance.

Japanese Unexamined Patent Application Publication No. 2011-192937 (Patent Literature 1) discloses a structure that dissipates the heat generated by the electronic component to the outside of the housing by the structure of the housing as described above.

CITATION LIST

Patent Literature

Patent Literature 1: Japanese Unexamined Patent Application Publication No. 2011-192937

SUMMARY OF INVENTION

Technical Problem

However, the structure of Patent Literature 1 has the structure where, a back surface side of the circuit board at a position in which the electronic component that generates a large amount of heat is mounted is bonded to the housing via the conductive adhesive and the like, and the heat is forcibly dissipated to the outside of the housing. When the component that generates a large amount of heat is isolated, the heat is dissipated from the housing by providing a protrusion having a size corresponding to the part. However, when the electronic components are mounted for each function, the components that generate a large amount of heat become adjacent in some cases. In this case, the heat dissipation is performed with a large protrusion and the like while collecting a plurality of electronic components including the periphery. There has been a problem that, when the housing is bonded to the back surface of the circuit board, where the large protrusion corresponds to the surface to which the electronic component is mounted, via the conductive adhesive and the like, deformation of the circuit board is significantly influenced by deformation of the housing, and strain generated on a solder joint portion of a signal terminal of the electronic component increases, thereby decreasing connection reliability. There has been a problem that performing the surface treatment to promote absorption and dissipation of the heat to the housing increases the manufacturing process, thereby to increase the cost.

It is an object of the present invention to solve the above-described problems in the prior art, and to decrease the strain acting on a heating element mounted to the substrate to improve the connection reliability.

The above-described and other objects and novel features of the present invention will become clear by descriptions and attached drawings in this description.

Solution to Problem

An outline of a representative embodiment of the present invention disclosed in this application is briefly described as follows.

In the present invention, to solve the above-described problems, an electronic control device includes a heating element, a substrate, and a housing. The heating element includes an electronic component. The heating element is mounted to the substrate. The substrate is fixed to the housing via a substrate fixing portion. The housing includes a plurality of projecting portions projecting to the substrate side from a reference surface. The plurality of projecting portions have mutually different heights from the reference surface. The reference surface is a surface opposing the substrate and a reference of a height of the housing. The projecting portion highest in the height from the reference surface among the plurality of projecting portions is in contact with a surface of the substrate via a heat dissipation member. The surface of the substrate is on an opposite side of a surface where the heating element is mounted.

Advantageous Effects of Invention

An effect provided by the representative embodiment of the present invention disclosed in this application is briefly described as follows.

According to the present invention, the strain acting on the heating element mounted to the substrate can be decreased to improve the connection reliability.

BRIEF DESCRIPTION OF DRAWINGS

FIG. 7A is a main part cross-sectional view of a model A, FIG. 7B is a main part cross-sectional view of a model B, and FIG. 7C is a main part cross-sectional view of a model C.

DESCRIPTION OF EMBODIMENTS

First Embodiment

Figure 1:
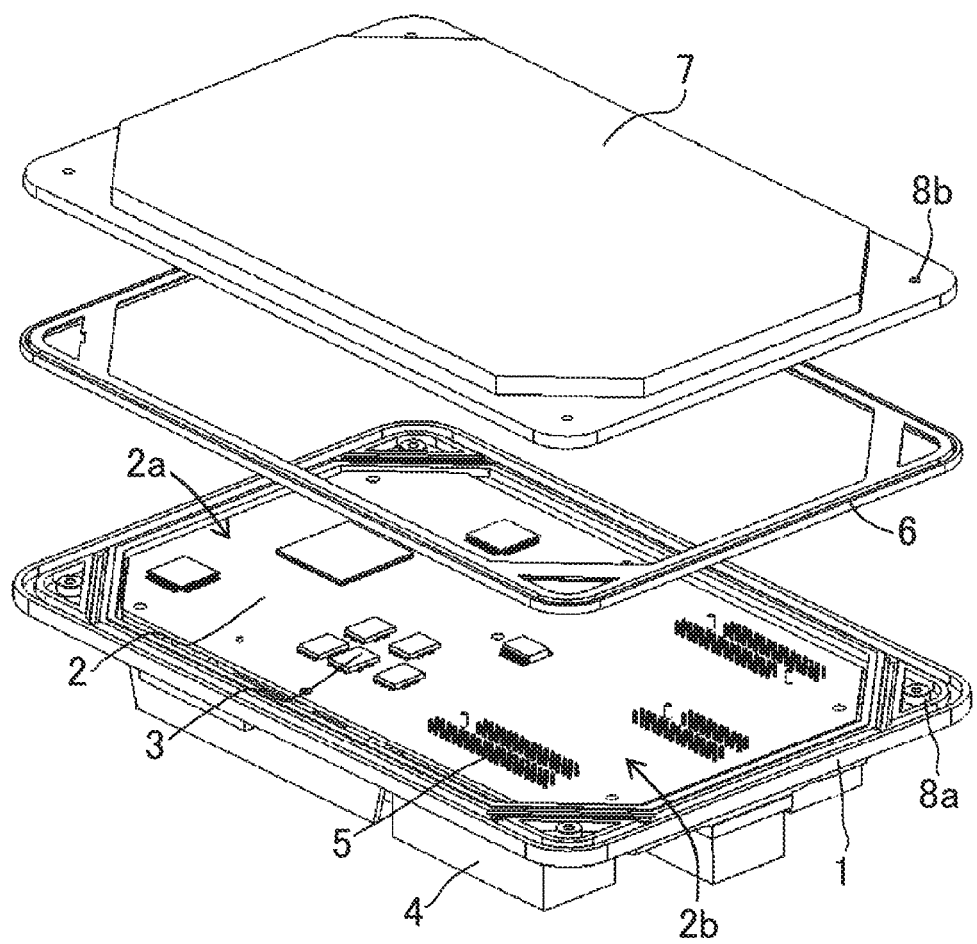
FIG. 1 is a development diagram of an electronic control device in a first embodiment.

The first embodiment of an electronic control device according to the present invention will be described with reference to FIG. 1 to FIG. 5. FIG. 1 is a development diagram of the electronic control device in the first embodiment. In FIG. 1, the electronic control device includes a housing 1, a sealing material 6, and a lid 7. The housing 1 is formed as a container for housing an approximately rectangular-shaped circuit board 2, and the circuit board 2 is mounted to the housing 1. A top of the circuit board 2 is divided into mainly an electronic component arrangement region 2a and a connector pin arrangement region 2b, and a plurality of electronic components 3 and the like are dispersedly mounted to the electronic component arrangement region 2a while a plurality of components, such as a connector pin 5, are dispersedly mounted to the connector pin arrangement region 2b. The electronic component 3 illustrated in the drawing is a component (component to be a heating element) that has a large heat generation among the mounted components and requires active heat dissipation. Therefore, it is needless to say that a large number of not described various components are mounted to the circuit board 2. Typically, the circuit board 2 is often designed to divide an area for each function. Therefore, as illustrated in FIG. 1, a part where similar components are densely mounted is generated. On a back surface of the housing 1, a plurality of connectors 4 for connection to external devices are mounted, and the respective connectors 4 have connecting terminals (not illustrated) electrically coupled to the circuit board 2 by respective connector pins 5. The electronic control device needs to avoid corrosion due to water, and the housing 1 is adhered to the lid 7 via the approximately rectangular-shaped sealing material 6. In this respect, for strongly fixing the lid 7 to the housing 1, fixing portions 8b formed at four corners of the lid 7 are fastened to respective fixing portions 8a formed at four corners of the housing 1 by screws (not illustrated).

Figure 2:
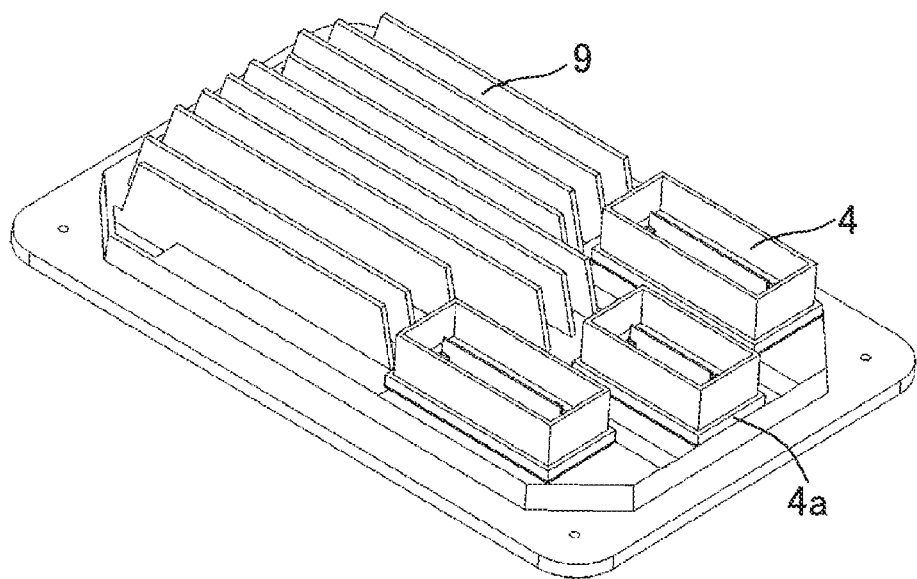
FIG. 2 is a back surface perspective view of the electronic control device in the first embodiment.

FIG. 2 is a back surface perspective view of the electronic control device. In FIG. 2, a plurality of connector mounting portions 4a are integrally formed with the housing 1 in a region corresponding to the connector pin arrangement region 2b of the circuit board 2 (region on the back surface side of the connector pin arrangement region 2b of the circuit board 2) on the back surface side of the housing 1, and the respective connectors 4 are mounted to the connector mounting portions 4a. To the respective connectors 4, male connectors to connect the electronic control device to the external devices are coupled. In order to cool the electronic control device, a plurality of cooling fins 9 which project from the housing 1 are integrally formed with the housing 1, in a region corresponding to the electronic component arrangement region 2a of the circuit board 2 (region on the back surface side of the electronic component arrangement region 2a of the circuit board 2) on the back surface side of the housing 1. By making a gas flow between each of the cooling fins 9, the heat generated by each of the electronic components 3 can be dissipated to avoid temperature increase in each of the electronic components 3. The cooling system includes an air cooling system and a water cooling system, and the structure illustrated in the drawing is the air cooling system. When the water cooling system is employed, it is needless to say that a structure where a cooling water does not leak is required.

Figure 3:
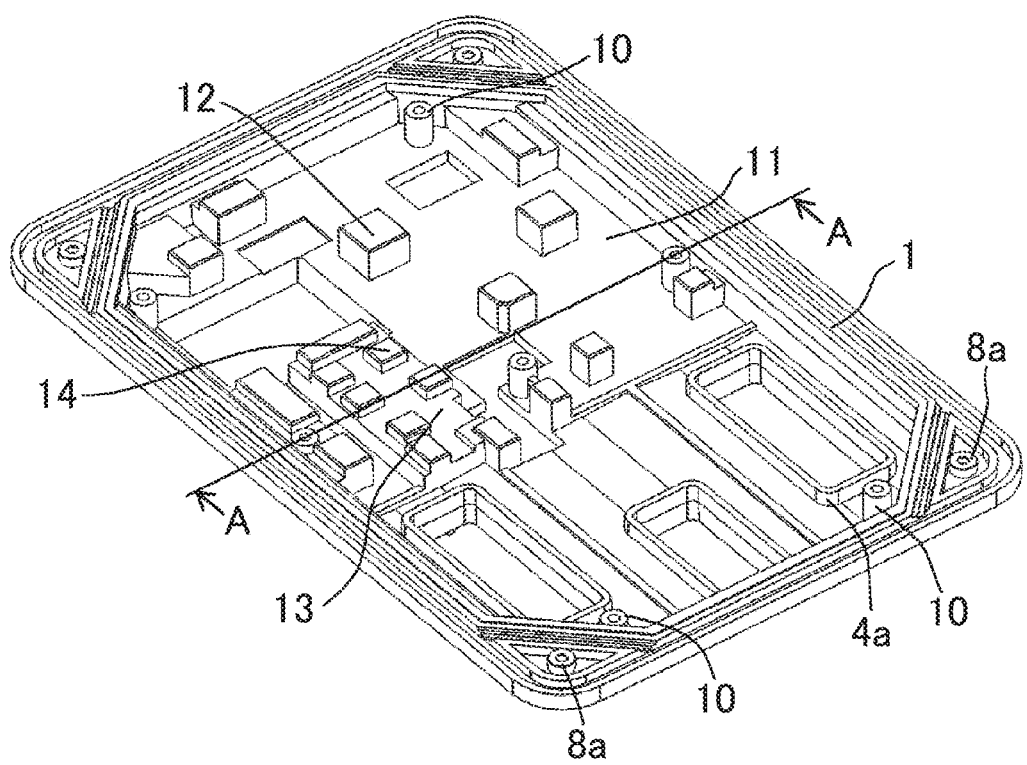
FIG. 3 is a perspective view of a housing of the electronic control device in the first embodiment.

FIG. 3 is a perspective view of the housing of the electronic control device. In FIG. 3, on a front surface side of the housing 1, a plurality of substrate fixing portions 10, which are protrusions to fix the circuit board 2 and project from a reference surface 11 to the circuit board 2 side, are dispersedly disposed at seven positions (four positions inside the fixing portions 8a, three positions at intermediate positions). The circuit board 2 is fixed at the respective substrate fixing portions 10 using screws. A plurality of connector mounting portions 4a are integrally formed with the housing 1 in a region corresponding to the back surface side of the connector pin arrangement region 2b of the circuit board 2 on the front surface side of the housing 1. A plurality of projecting portions 12, 13, 14, which are mutually different in height from the reference surface 11, are integrally formed with the housing 1 in a region corresponding to the back surface side of the electronic component arrangement region 2a of the circuit board 2.

That is, in a region where the electronic components 3 that generate a large amount of heat and require the heat dissipation are interspersed, on the housing 1 directly below the circuit board 2, the projecting portion 12 is disposed. The projecting portion 12 is a protrusion projecting to the upper side (circuit board 2 side) with respect to the reference surface 11 that has the largest area on the front surface of the housing 1. In a region where the electronic components 3 that require the heat dissipation are densely mounted, on the housing 1 directly below the circuit board 2, the projecting portion (first projecting portion) 13 is disposed. The projecting portion 13 is a protrusion projecting to the upper side with respect to the reference surface 11. Furthermore, in a region as a part of the projecting portion (first projecting portion) 13 and the region where the electronic component 3 that requires the heat dissipation exists, on the housing 1 directly below the circuit board 2, a plural pieces of a plurality of projecting portions (second projecting portion) 14 are dispersedly disposed. The heat generated by the electronic components 3 that require the heat dissipation is transmitted to the cooling fins 9 via the projecting portion 12, and transmitted to the cooling fins 9 from the projecting portion 14 via the projecting portion 13, thus being dissipated outside the electronic control device. The projecting portion 13 has a structure of being disposed on the periphery of the substrate fixing portion 10 at the intermediate position of the housing 1 to reduce the deformation of the circuit board 2. With the configuration in which the projecting portion 13 and the projecting portion 14 are disposed at the position on the housing 1 where the electronic components 3 that generate a large amount of heat and require the heat dissipation are densely mounted, there is provided an effect that, in the manufacturing process of the housing 1, deep grooves of a mold for die casting can be reduced and portions that hinder molten fluidity can be reduced, thereby ensuring reduction of failure in manufacture, such as a shrinkage cavity and a void. Disposing the substrate fixing portion 10 on the periphery of the projecting portion 13 provides an effect of reducing the deformation of the circuit board 2.

Figure 4:
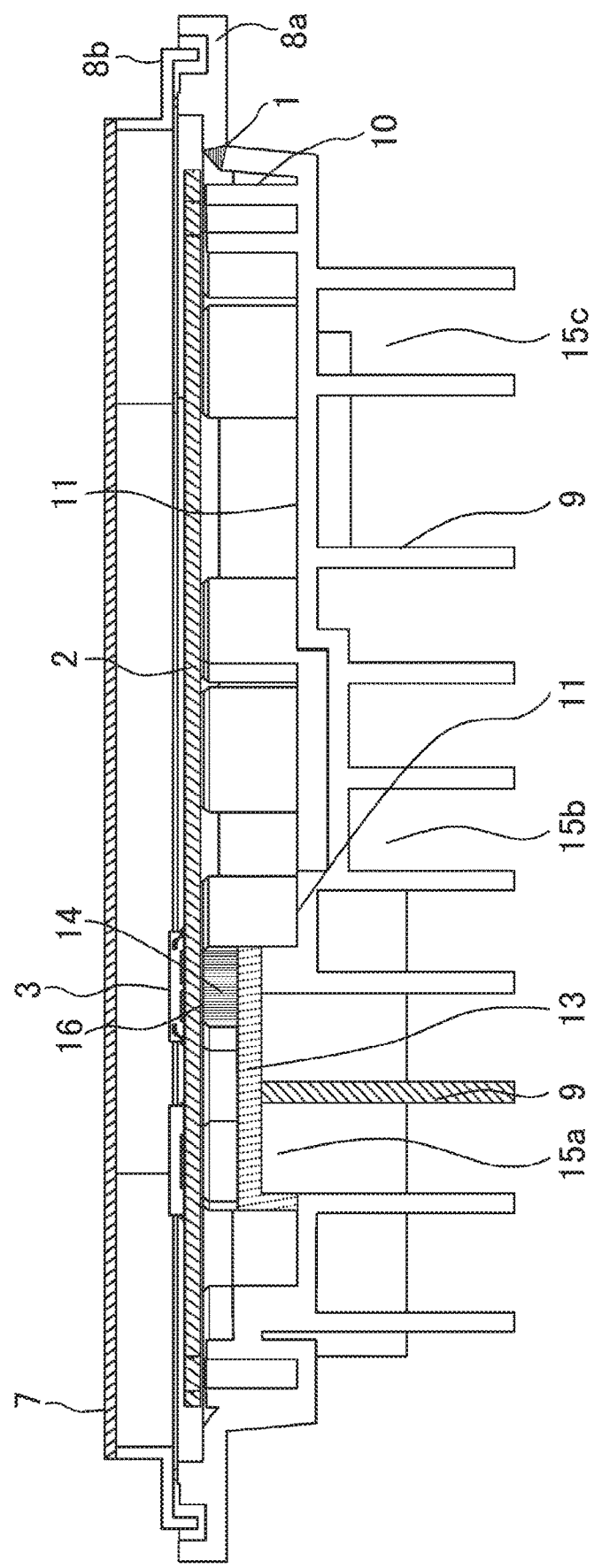
FIG. 4 is a cross-sectional view taken along the line A-A of the electronic control device in the first embodiment.

FIG. 4 is a cross-sectional view of the electronic control device corresponding to the position of A-A of FIG. 3 (cross-sectional view taken along the line A-A of the electronic control device). In FIG. 4, the circuit board 2 is disposed on the upper side of the housing 1, and a plurality of electronic components 3 are mounted to the circuit board 2. The lid 7 is disposed upward the circuit board 2 via the sealing material 6, and the fixing portions 8b on both end sides of the lid 7 are secured to the fixing portions 8a of the housing 1. On the housing 1, the projecting portions 12, 13 are formed to project upward (circuit board 2 side) with respect to the reference surface 11 having the reference surface 11 as a reference height, and the projecting portion 14, which projects upward with respect to the reference surface 11, is formed on a part of the upper side of the projecting portion 13. The projecting portion 14 is disposed to be in contact with the back surface (back surface of the region where the electronic component 3 exists) of the circuit board 2 via a heat dissipation member 16. On the lower side of the housing 1, a plurality of the cooling fins 9 are formed to be mutually adjacent. Between each of the cooling fins 9, grooves 15a, 15b, and 15c are formed. The groove 15a is formed on the back surface of the projecting portion 13 including the projecting portion 14, and the groove 15a is formed so as to have a depth (length) deeper (longer) than that of other grooves, for example, the groove 15c formed on the back surface of the reference surface 11. That is, the cooling fin (first cooling fin) 9 formed on the back surface of the projecting portion 13 including the projecting portion 14 is formed to be longer than the cooling fin (second cooling fin) 9 at another portion (back surface side of the reference surface 11) for dissipating the heat of the electronic component 3 with less thermal resistance. Accordingly, the thermal resistance at the portion of the projecting portion 13 on the housing 1 can be reduced to improve the heat dissipation efficiency.

Figure 5:
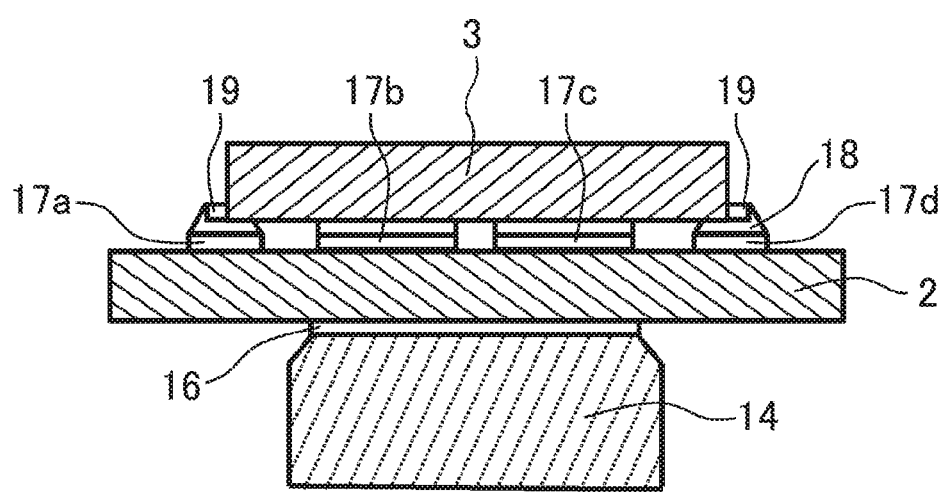
FIG. 5 is a main part enlarged cross-sectional view of a circuit board of the electronic control device in the first embodiment.

FIG. 5 is a main part enlarged cross-sectional view of the circuit board of the electronic control device in the first embodiment. In FIG. 5, on the top surface of the circuit board 2, a plurality of lands 17a, 17b, 17c, and 17d are formed. The lands 17a and 17d positioned on both end sides of the electronic component 3 are coupled to terminals (signal terminals) 19 of the electronic component 3 via solders 18, and the lands 17b and 17c positioned at intermediate positions on the bottom side of the electronic component 3 are coupled to a heat sink (not illustrated) at the bottom portion of the electronic component 3 via solders 18. The projecting portion 14 of the housing 1 is in contact with a region downward the lands 17b and 17c on the lower surface (back surface) of the circuit board 2 via the heat dissipation member 16. In this respect, the projecting portion 14 is disposed so as to have the top surface positioned in a region outside regions downward the lands 17a and 17d. By disposing the projecting portion 14 so as to have the top surface positioned in the region outside the regions downward the lands 17a and 17d, even if a strain occurs on the solder 18 due to the temperature change, the circuit board 2 easily deforms. Therefore, a stress due to the strain of the solder 18 can be assigned also to the circuit board 2 side, thereby ensuring reduction of the action of the stress due to the strain of the solder 18 on the terminal 19 of the electronic component 3. An area of a surface opposing the circuit board 2 of the projecting portion 14 is smaller than a mounting area of the electronic component (heating element) 3 mounted to the circuit board 2, and an area where the housing 1 is in contact with the circuit board 2 can be decreased. Therefore, the amount of the heat dissipation member 16 can be reduced.

According to the embodiment, the circuit board 2 on the periphery of the electronic component 3 is in contact with only the top surface of the projecting portion 14 via the heat dissipation member 16. Therefore, the deformation of the circuit board 2 is not hindered, and the strain applied to the solder 18 at the solder joint portion of the terminal (signal terminal) 19 of the electronic component 3 can be reduced, thus ensuring the improvement of the connection reliability.

Second Embodiment

Figure 6:
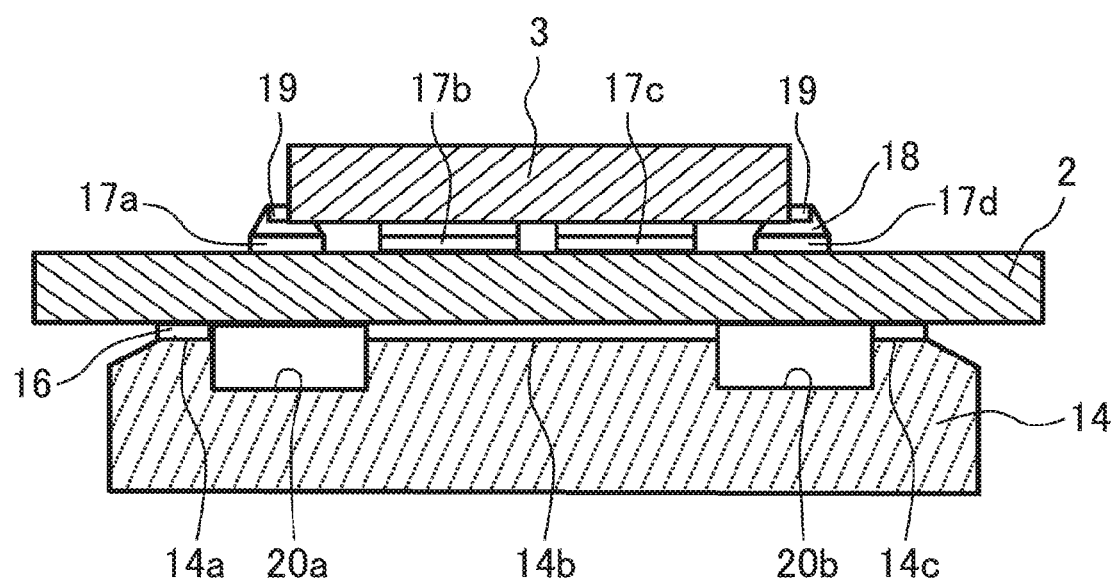
FIG. 6 is a main part enlarged cross-sectional view of a circuit board of an electronic control device in a second embodiment.

The second embodiment of the electronic control device according to the present invention will be described with reference to FIG. 6. FIG. 6 is a main part enlarged cross-sectional view of the circuit board of the electronic control device in the second embodiment. In FIG. 6, in this embodiment, on the top surface of the circuit board 2, similarly to FIG. 5, a plurality of lands 17a, 17b, 17c, and 17d are formed. The lands 17a and 17d are coupled to the terminals (signal terminals) 19 of the electronic component 3 via the solders 18, and the lands 17b and 17c are coupled to the heat sink at the bottom portion of the electronic component 3 via the solders 18. Meanwhile, the projecting portion 14 of the housing 1 disposed on the lower surface (back surface) side of the circuit board 2 has, unlike FIG. 5, an upper side divided into three supporting portions 14a, 14b, and 14c. Between the supporting portion 14a and the supporting portion 14b, a depressed portion 20a forming a space with the circuit board 2 is provided, and between the supporting portion 14b and the supporting portion 14c, a depressed portion 20b forming a space with the circuit board 2 is provided. The projecting portion 14 has the supporting portions 14a, 14b, and 14c each in contact with the lower surface of the circuit board 2 via the heat dissipation member 16.

In this respect, the supporting portions 14a, 14b, and 14c of the projecting portion 14 are formed so as to have the total surface area larger than the total surface area of the lands 17a and 17d coupled to the terminals 19. The supporting portion 14a of the projecting portion 14 is disposed to be positioned in a region outside the region downward the land 17a, the supporting portion 14b of the projecting portion 14 is disposed to be positioned in a region downward the lands 17b and 17c, and the supporting portion 14c of the projecting portion 14 is disposed to be positioned in a region outside the region downward the land 17d. That is, the depressed portions 20a and 20b of the projecting portion 14 are positioned in the regions downward the lands 17a and 17d coupled to the respective terminals 19 of the electronic component 3. The supporting portions 14a and 14c of the projecting portion 14 support both end sides of the electronic component 3 via the circuit board 2. By employing this structure, even if a strain occurs on the solder 18 due to the temperature change, the circuit board 2 easily deforms to the depressed portions 20a and 20b sides. Therefore, a stress due to the strain of the solder 18 can be assigned also to the circuit board 2 side, thereby ensuring reduction of the action of the stress due to the strain of the solder 18 on the terminal 19 of the electronic component 3.

According to the embodiment, the circuit board 2 on the periphery of the electronic component 3 is in contact with only the supporting portions 14a, 14b, and 14c on the top surface of the projecting portion 14 via the heat dissipation member 16. Therefore, even if a strain occurs on the solder 18 due to the temperature change, the circuit board 2 easily deforms to the depressed portions 20a and 20b sides, and the strain applied to the solder 18 at the solder joint portion of the terminal (signal terminal) 19 of the electronic component 3 can be further reduced, thus ensuring the improvement of the connection reliability.

(Validation of Effect of First and Second Embodiments)

Figure 7A:
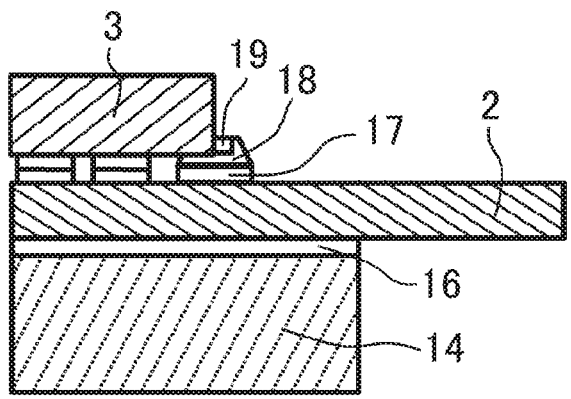
FIGS. 7A to 7C include drawings of analytical models used for validation.
Figure 7B:
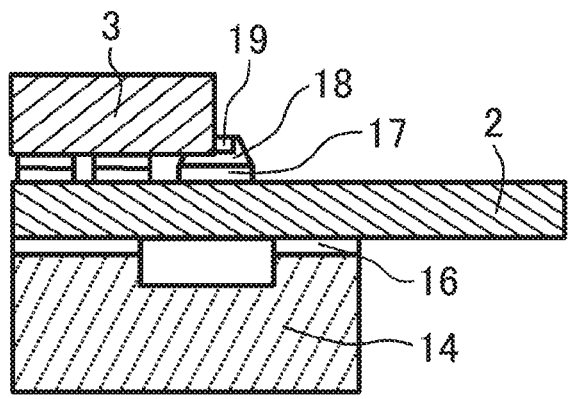
Figure 7C:
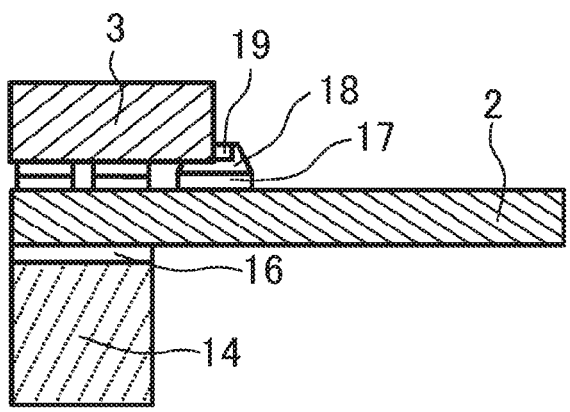

The effects of the first and the second embodiments will be described with reference to FIG. 7 and FIG. 8. FIG. 7 includes drawings for describing analytical models of quarter models of the electronic control device. FIG. 7(a) is a main part cross-sectional view of a model A, FIG. 7(b) is a main part cross-sectional view of a model B, and FIG. 7(c) is a main part cross-sectional view of a model C. The model A is a model that simulates a case where the projecting portion 14 of the housing 1 is coupled to the circuit board 2 in a region downward the terminal 19. The model B is a model that simulates the second embodiment. The model C is a model that simulates the first embodiment. The models A, B, and C were used to perform a thermal stress analysis, and analysis results as illustrated in FIG. 8 were obtained.

Figure 8:
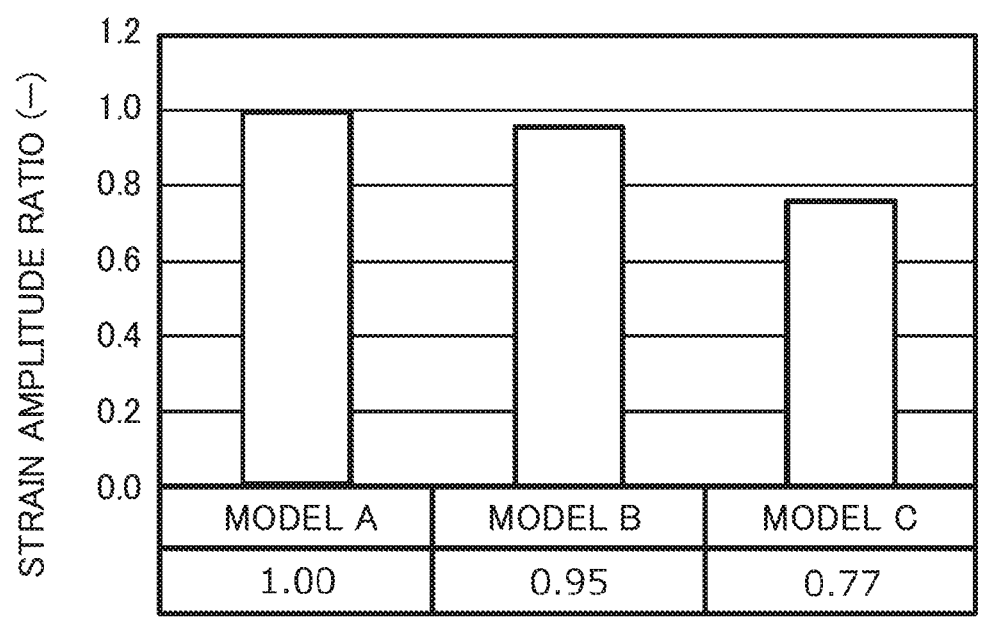
FIG. 8 is a drawing illustrating analysis results of the analytical models.

FIG. 8 is a characteristic diagram illustrating strain amplitude ratios of the respective models. In FIG. 8, the strain amplitude ratios of the respective models A, B, and C are indices for evaluating lifespan of the solder, and the thermal stress analysis that simulates a thermal shock was performed for each of the models A, B, and C, thus using an equivalent plastic strain at a minimum temperature and an equivalent plastic strain at a maximum temperature to obtain the strain amplitude ratio of the two. In this respect, the strain amplitudes of the models B and C were obtained assuming that the strain amplitude of the model A was 1. Consequently, the effects of 5% for the model B (second embodiment) and more than 20% for the model C (first embodiment) were confirmed.

The present invention is not limited to the above-described embodiments, and various modifications are included. For example, the above-described embodiments are detailed descriptions to describe the present invention to be easily understood, and it is not necessarily limited to one that includes all the described configurations. Apart of the configurations of one embodiment can be replaced by the configuration of another embodiment, and a configuration of one embodiment can be added to a configuration of another embodiment. Regarding a part of the configurations in the respective embodiments, another configuration can be added, deleted, or replaced.

LIST OF REFERENCE SIGNS 1 housing
2 circuit board
3 electronic component
7 lid
10 substrate fixing portion
11 reference surface
12, 13, 14 projecting portion
16 heat dissipation member
20 depressed portion

The invention claimed is:

1. An electronic control device comprising:
   a heating element that includes an electronic component;
   a substrate to which the heating element is mounted; and
   a housing to which the substrate is fixed via a substrate fixing portion,
   wherein the housing includes a plurality of projecting portions projecting to the substrate side from a reference surface which is a surface opposing the substrate and is a reference of a height of the housing, the plurality of projecting portions having mutually different heights from the reference surface, and
   wherein the projecting portion highest in the height from the reference surface among the plurality of projecting portions is in contact with a surface of the substrate via a heat dissipation member, the surface of the substrate being on an opposite side of a surface where the heating element is mounted;
   wherein the plurality of projecting portions include:
      a first projecting portion formed on the reference surface; and
      a second projecting portion dispersedly disposed on the first projecting portion,
   the second projecting portion is in contact with the surface of the substrate on the opposite side of the surface where the heating element is mounted and directly below the heating element, via the heat dissipation member, and
   the second projecting portion includes a plurality of depressed portions that form spaces with the substrate on a surface opposing the substrate.

2. The electronic control device according to claim 1, wherein the second projecting portion is disposed in a region where the heating element exists on an upper side of the substrate with the substrate interposed.

3. The electronic control device according to claim 1, wherein the housing includes a plurality of cooling fins on a surface on an opposite side of the reference surface.

4. The electronic control device according to claim 3, wherein
   a first cooling fin formed on an opposite side of the first projecting portion having the reference surface as a reference; and
   a second cooling fin formed adjacent to the first cooling fin, and
   the first cooling fin has a groove with a depth formed to be deeper than a depth of a groove of the second cooling fin.

5. The electronic control device according to claim 1, wherein the plurality of depressed portions are formed in regions corresponding to terminals of the electronic component in the heating element.

* * * * *